United States Patent
Wold et al.

[11] Patent Number: 6,016,025
[45] Date of Patent: *Jan. 18, 2000

[54] SELECTED OVERTONE RESONATOR WITH CHANNELS

[75] Inventors: Cyle E. Wold; Barry A. Arneson, both of Yankton, S. Dak.

[73] Assignee: M-Tron Industries, Inc., Yankton, S. Dak.

[*] Notice: This patent issued on a continued prosecution application filed under 37 CFR 1.53(d), and is subject to the twenty year patent term provisions of 35 U.S.C. 154(a)(2).

[21] Appl. No.: 08/856,543

[22] Filed: May 15, 1997

[51] Int. Cl.⁷ ............................................. H01L 41/08
[52] U.S. Cl. ..................... 310/369; 310/312; 310/366; 310/367
[58] Field of Search ................... 310/312, 320, 310/366, 367, 369

[56] References Cited

U.S. PATENT DOCUMENTS

| | | | |
|---|---|---|---|
| 2,161,980 | 6/1939 | Runge et al. | 310/369 X |
| 2,301,269 | 11/1942 | Gerber | 310/369 X |
| 2,543,500 | 2/1951 | Kettering et al. | 310/369 X |
| 3,523,200 | 8/1970 | Newell | 310/369 X |
| 3,561,832 | 2/1971 | Karrer et al. | 310/367 X |
| 3,805,097 | 4/1974 | Yanchich | 310/367 X |
| 4,135,108 | 1/1979 | Besson | 310/369 X |
| 4,221,986 | 9/1980 | Besson | 310/369 X |
| 4,455,502 | 6/1984 | Nakatani | 310/368 |
| 4,562,375 | 12/1985 | Besson et al. | 310/369 X |
| 4,626,732 | 12/1986 | Debaisieux et al. | 310/369 X |
| 4,641,055 | 2/1987 | Tanaka | 310/368 |
| 5,422,532 | 6/1995 | Inoue et al. | 310/326 |
| 5,548,178 | 8/1996 | Eda et al. | 310/369 X |

FOREIGN PATENT DOCUMENTS

| | | |
|---|---|---|
| 0 680 142 A1 | 11/1995 | European Pat. Off. . |
| 59-128813 | 7/1984 | Japan ................... 310/367 |
| 0207615 | 8/1990 | Japan ................... 310/367 |
| 328152 | 4/1930 | United Kingdom . |
| 2 004 116 | 3/1979 | United Kingdom . |
| 2 282 260 | 3/1995 | United Kingdom . |

*Primary Examiner*—Mark O. Budd
*Attorney, Agent, or Firm*—Merchant & Gould P.C.

[57] ABSTRACT

A resonator having piezoelectric properties is tuned to respond at a specific overtone of its parallel plate resonant frequency. A channel is etched in a blank to confine the oscillations to a predefined area thereby maximizing a predetermined overtone. The position and dimension of the channel are selected to confine the oscillation to a radius that maximizes the response at a desired frequency. The desired frequency is a predetermined overtone of the fundamental frequency. The channel limits the area of oscillation of the blank. The channel may be formed using grooves or slots. The slots are arranged to form a ring. The channel may be positioned inside or outside an electrode.

22 Claims, 8 Drawing Sheets

SELECTED OVERTONE RESONATOR WITH CHANNELS

BACKGROUND OF THE INVENTION

1. Field of the Invention

This invention relates in general to resonators, and more particularly to a piezoelectric resonator tuned to respond at a specific overtone of its parallel plate resonant frequency.

2. Description of Related Art

Crystals are widely used in frequency control applications because of their unequaled combination of high Q, stability and small size. The Q values of crystal units are much higher than those attainable with other circuit elements. In general-purpose crystal units, typical Q's are in the range of $10^4$ to $10^6$.

Some crystals, in particular quartz crystals, are highly anisotropic, that is, their properties vary greatly with crystallographic direction. For example, when a quartz sphere is etched in hydrofluoric acid, the etching rate is more than 100 times faster along the fastest etching rate direction, the Z-direction, than along the slowest direction, the slow-X-direction. The constants of quartz, such as the thermal expansion coefficient and the temperature coefficients of the elastic constants, also vary with direction. That crystal units can have zero temperature coefficients of frequency is a consequence of the temperature coefficients of the elastic constants ranging from negative to positive values.

The locus of zero-temperature-coefficient cuts in quartz 100 is shown in FIG. 1a. The X 102, Y 104, and Z 106 directions have been chosen to make the description of properties as simple as possible. The Z-axis 106 in FIG. 1a is an axis of threefold symmetry in quartz; in other words, the physical properties repeat every 120° as the crystal is rotated about the Z-axis 106. The cut may comprise a singly rotated cuts 120 and double rotated cuts 130 having angles φ 140 and θ 142.

FIG. 1b illustrates the relationship 150 of several different quartz cuts. The cuts usually have two-letter names, where the "T" in the name indicates a temperature-compensated cut. For instance, the AT-cut 160 was the first temperature-compensated cut discovered. The FC 162, IT 164, BT 166, and RT 168 cuts are other cuts along the zero temperature coefficient locus. These cuts were studied before the discovery of the SC cut 170 for some special properties, but are rarely used today. Today, the highest-stability crystal oscillators employ SC cut 170 or AT cut 160 crystal units.

A resonator typically includes suitably mounted and electroded plates of piezoelectric material using bulk acoustic wave (BAW) vibrations. Those skilled in the art will readily recognize that while quartz is a preferred piezoelectric material for crystals, other piezoelectric materials could be used in a resonator. Accordingly, the present invention described herein below is not meant to be limited to quartz crystals. However, for clarity of presentation, the discussion will primarily focus on examples using quartz blanks.

Plates, also called wafers or blanks, are fabricated at a precise orientation with respect to the crystallographic axes of the quartz material. Originally quartz plates were made from natural quartz, but today cultured quartz is used almost exclusively.

The cut and geometry of the quartz plate determine the resonator frequency for a chosen mode of vibration of the plate. In general the plate resonant frequency is inversely related to a plate dimension. Extension, face shear, flexure and thickness are typical types of vibration. The cut and type of vibration are intimately related and can be classified as low frequency or high frequency depending on the range of resonant frequencies over which they are commonly used.

When designing an oscillator with stringent stability requirements, the stability and accuracy of frequency control is required. Plates of piezoelectric materials show a mechanical movement or strain when subjected to an electrical charge. Conversely, they show a potential difference between the two faces when subjected to a mechanical stress. This relationship is known as the piezoelectric effect. Because of its electro-mechanical properties, a plate placed in an oscillator circuit can be made to oscillate both mechanically and electrically, with its resonant frequency determined primarily by its mechanical dimensions.

Normally these plates have a uniform thickness between the electrodes. However, a plate will resonate vigorously when the driving frequency results in an odd number [1,3, 5,7, etc.] of acoustic half-wavelengths between the plates. The number of half wavelengths in a uniformly thick area is known as the "overtone number". At resonance "standing waves" occur that include, at fixed positions, nodes (planes of zero amplitude), and antinodes (plains of maximum amplitude).

The lowest resonant frequency, known as the "fundamental frequency", is inversely proportional to the thickness of the crystal. There are practical limits to how thin a plate can be made. Thus, for high frequencies, a high "overtone," which is very nearly an integer multiple of the fundamental frequency, is desired. This integer multiple of the fundamental frequency is referred to as the overtone number. The term "$1^{st}$ overtone" will be used herein to mean the fundamental frequency since one times this frequency is the same frequency.

The accuracy and stability of piezoelectric materials far surpass the performance obtained by circuits utilizing conventional capacitors, inductors, and resistors. A typical two-point mount package 200 is shown in FIG. 2. The crystal consists of a blank 202 with a metal electrode 204 on each of the two major surfaces. The electrodes 204 are connected to mounting clips 206 at a bonding area 208. The mounting clips 206 couple the resonator 202 to a leaded header or base 210. At a later stage, the crystal is encapsulated by welding a cover 220 over the assembly.

This resonator behaves electrically as the circuit in FIG. 3. This circuit is called the equivalent circuit for the resonator. The mechanical losses of the resonator appear as an equivalent series resistance, R1 302, while the mechanical elasticity of the resonator is equivalent to a series capacitor, $C_1$ 304. $C_0$ 306 is the parallel capacitance associated with the holder and the electrode capacitance. The frequency of a resonator operating at series resonance is given by:

$$f_x = \frac{1}{2\Pi\sqrt{L_1 C_1}}$$

At series resonance the reactance of $C_1$ 304 and $L_1$ 310 are equal and opposite. Thus, the net reactance of the series circuit is zero. At this point the resonator appears as a resistance $R_1$ 302.

It is known to tune resonators so that they respond to a specific overtone of its parallel plate resonant frequencies. One approach is reduce the blank diameter to degrade its response at the fundamental and higher modes below the desired overtone frequency and to increase its response at the frequency of the desired overtone. Another approach is to apply mass loading in the form of a metal ring. FIG. 4 illustrates this mass loading structure 400. In FIG. 4, a metal ring 402 substantially circumscribes a top electrode 404 over a blank 406. A similar pattern is also applied to the bottom of the blank 406.

Nevertheless each of the above methods has its disadvantages. The first method leads to the blank diameter becoming inconveniently small thereby causing problems in manufacturing. In the second method, the metal ring 402 introduces unwanted parasitic capacity in the resonator circuit which can reduce the output power and degrade the oscillator quality factor (Q).

It can be seen that there is a need for a method of controlling the overtone frequency for a piezoelectric blank.

It can also be seen that there is a need for a piezoelectric blank tuned to respond at a specific overtone of its parallel plate resonant frequency.

SUMMARY OF THE INVENTION

To overcome the limitations in the prior art described above, and to overcome other limitations that will become apparent upon reading and understanding the present specification, the present invention discloses a resonator tuned to respond at a specific overtone of its parallel plate resonant frequency.

The present invention solves the above-described problems by providing a channel in a blank to confine the oscillations to a predefined area thereby maximizing a predetermined overtone.

A system in accordance with the principles of the present invention includes a blank having piezoelectric properties, wherein the blank oscillates when stimulated, a plurality of electrodes, coupled to the blank, for providing a signal to the blank to cause the blank to become stimulated at a fundamental frequency, and a channel cut into the blank, the position and dimension of the channel being selected to confine the oscillation to a radius that maximizes the response at a desired frequency.

Other embodiments of a system in accordance with the principles of the invention may include alternative or optional additional aspects. One such aspect of the present invention is that the desired frequency is a predetermined overtone of the fundamental frequency.

Another aspect of the present invention is that the channel limits the area of oscillation of the blank.

Another aspect of the present invention is that the channel further comprises a circular grove.

Another aspect of the present invention is that the channel further comprises a plurality of slots.

Another aspect of the present invention is that the plurality of slots are arranged to form a ring.

Yet another aspect of the present invention is that the channel is positioned outside an electrode.

Another aspect of the present invention is that the channel outside the electrode has an edge on antinodes of a Bessel function defining the radial node shape.

Another aspect of the present invention is that the channel is positioned inside an electrode.

Another aspect of the present invention is that the channel inside the electrode has an edge on nodes of a Bessel function defining the radial node shape.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE INVENTION

In the following description of the exemplary embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

The present invention provides an selected or assigned overtone resonator with channels to ensure that the desired overtone of the fundamental frequency has the lowest impedance.

As stated earlier, impedance is an electronic parameter that affects the flow of AC current through a device, such as a quartz crystal or other piezoelectric material. In the case of crystals, the impedance depends on the frequency, the thickness of the crystal, and the total area of the crystal. Decreasing the area of acoustic vibration, providing a large thickness, and supplying a low frequency increase the impedance.

An increased impedance makes it harder to excite the crystal into the resonant frequency. Further, the area of vibration extends somewhat beyond the boundary of the electrodes, especially when the electrodes are small. However, according to the invention, grooves (or slots) near the edges of the electrodes may be used to limit the area of vibration. With appropriate design of the crystal electrodes, thickness, which when combined with the desired overtone number determines the frequency, and appropriate design of the circuit that includes the crystal, the designer can ensure resonance with the lowest desired overtone number has the lowest impedance.

Figure 1A:
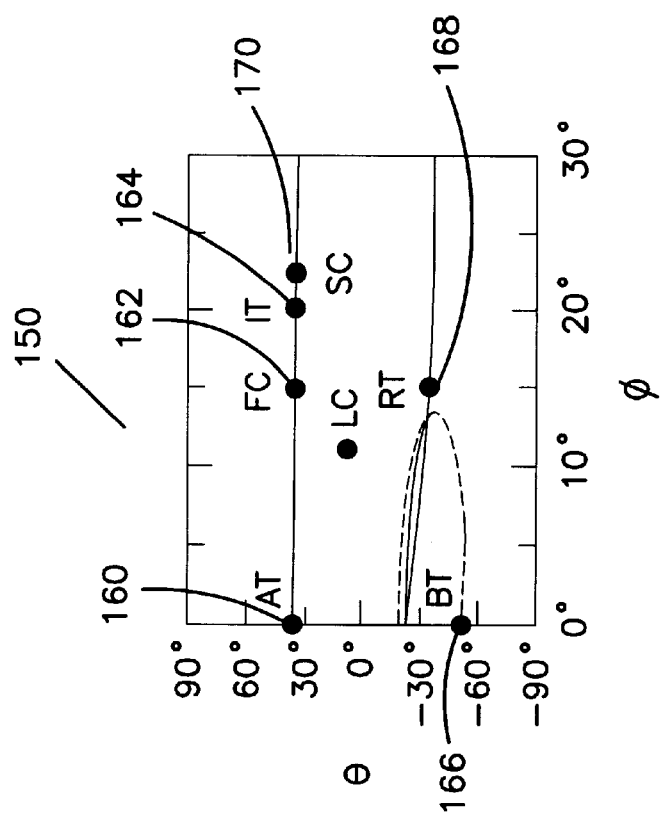
FIG. 1*a* illustrates the locus of zero-temperature-coefficient cuts in quartz.
Figure 1B:
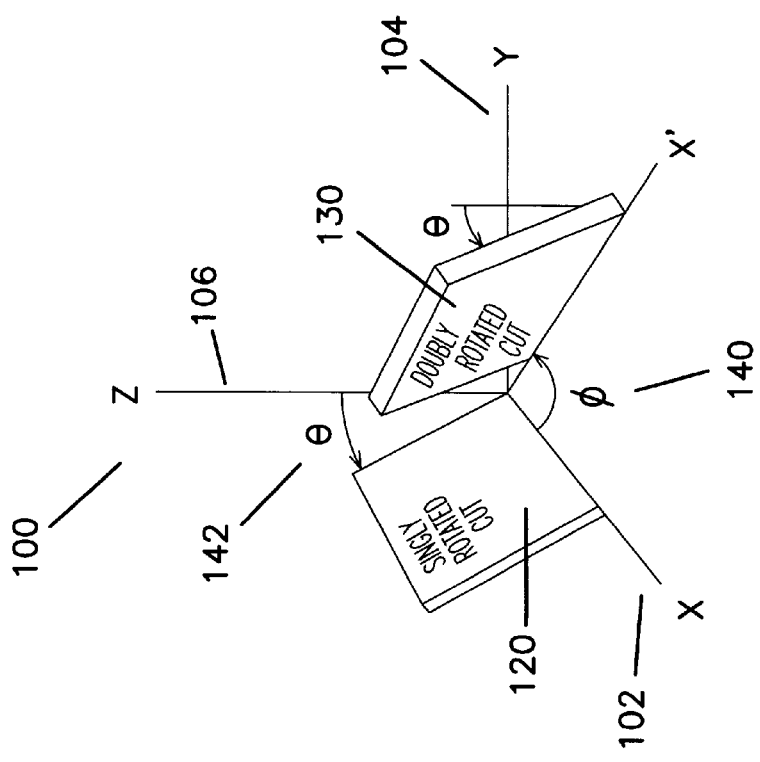
FIG. 1*b* illustrates the relationship of several different quartz cuts.
Figure 2:
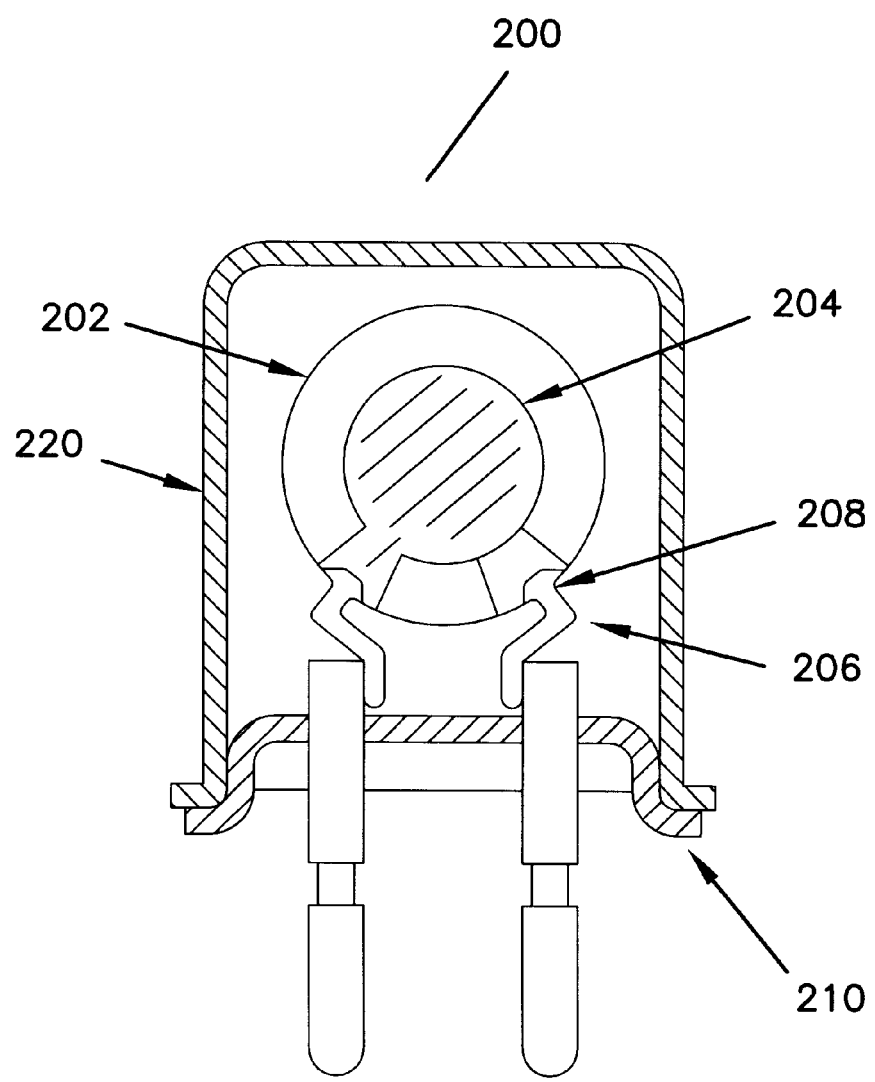
FIG. 2 illustrates a typical two-point mount package.
Figure 3:
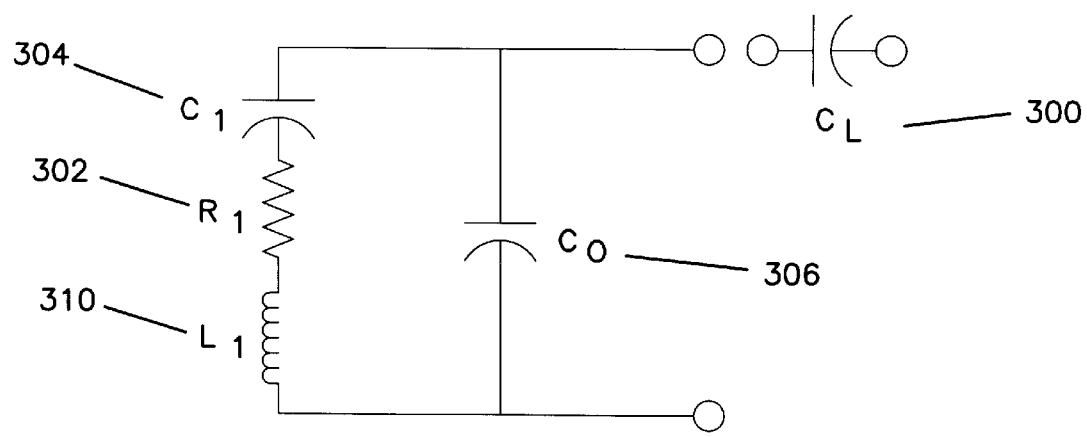
FIG. 3 illustrates an equivalent circuit for a resonator.
Figure 4:
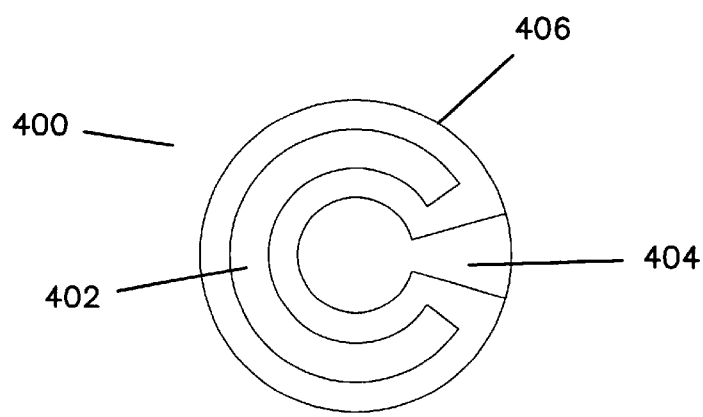
FIG. 4 illustrates a mass loading method for increasing the response of the blank at the frequency of the desired overtone.
Figure 5:
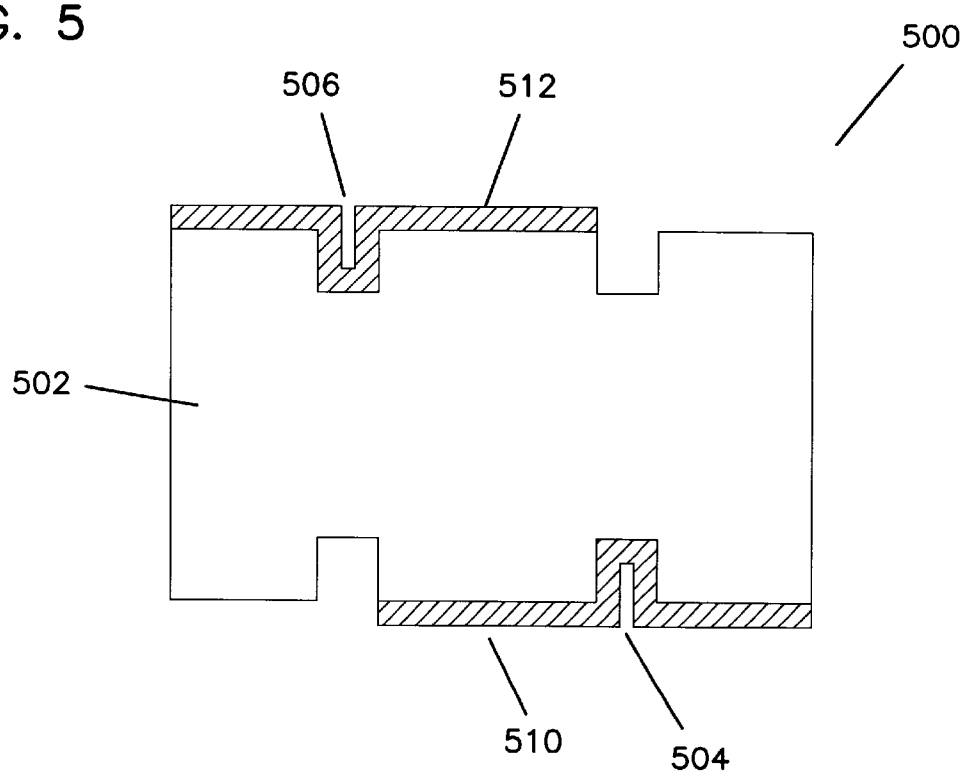
FIG. 5 illustrates a cross section of resonator for an oscillator according to the present invention.

According to the invention, the impedance characteristic is adjusted. To adjust the impedance characteristics, grooves and/or slots are used. FIG. 5 illustrates a cross section 500 of resonator 502 for an oscillator according to the present invention. The blank 502 of the oscillator has channel cuts or grooves 504, 506 encompassing the active area. For example, the grooves 504, 506 may be machined around the periphery of the circular metal electrodes 510, 512. The grooves 504, 506 are manifested by a narrow cut in the surface of the blank 502 to a specified depth. The grooves 504, 506 may also have different depths and may be disposed at different radial distances from the center of the electrodes 510, 512 according to the desired frequency requirements. Grooves may be formed on only one side of the blank 502, or alternatively, as illustrated in FIG. 5, may be formed on both sides of the blank 502.

In FIG. 5, one electrode 510 is formed at the center of the blank and includes an area of additional metal crossing the channel 504 and extending to the edge of the blank. A second such electrode 512 is formed on the other side of the blank crossing channel 506.

Figure 6:
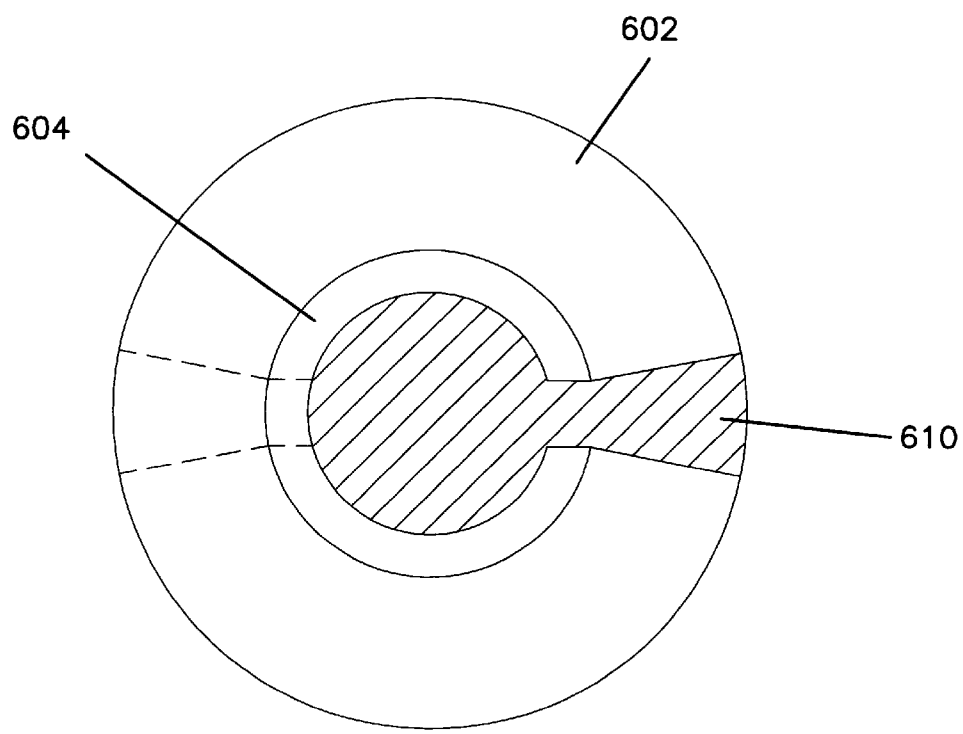
FIG. 6 illustrates a top view of the resonator of FIG. 5.

FIG. 6 illustrates a top view 600 of the resonator of FIG. 5. Channels 604 are cut in the blank 602 to degrade the lower frequency overtone and fundamental responses. The electrode 610 is shown in the center of the resonator extending across the channel 604 to the edge of the blank 602.

Accordingly, cut areas are formed by circular grooves which are etched or otherwise formed into one or both sides of the blank 602. However, those skilled in the art will recognize that grooves having a circular shape, but that elliptical or polygonal grooves could be used. Nevertheless, the edge circular grooves allow the blank diameter to be conveniently large while confining the piezoelectric oscillating node to a radius that maximizes the response at its desired overtone. Multiple grooves can be used to further enhance its desired overtone. The additional groove positions would be related to the maxima and/or nodes of the Bessel functions describing the radial vibrations of the desired node.

The appropriate location for rings and grooves can be determined. This position can be both outside of the electrode and inside of it. Rings of slots and grooves outside the electrode should have their edge on the antinodes of the Bessel function defining the radial node shape. Grooves inside the electrode have their edge on nodes of the node shape. Gaps in the metal can be used as the antinodes. The effect of these features is that fewer nodes have a Virgil Bottom's K index greater than one. This K index is the number of radial nodes under the metal electrode. The node shape from plate to plate is governed by the index N, which is the number of half wave lengths between the plates. Radial slots could also be used. The radial slots could be used to select modes with a Virgil Bottom's m-index greater than zero.

Figure 7:
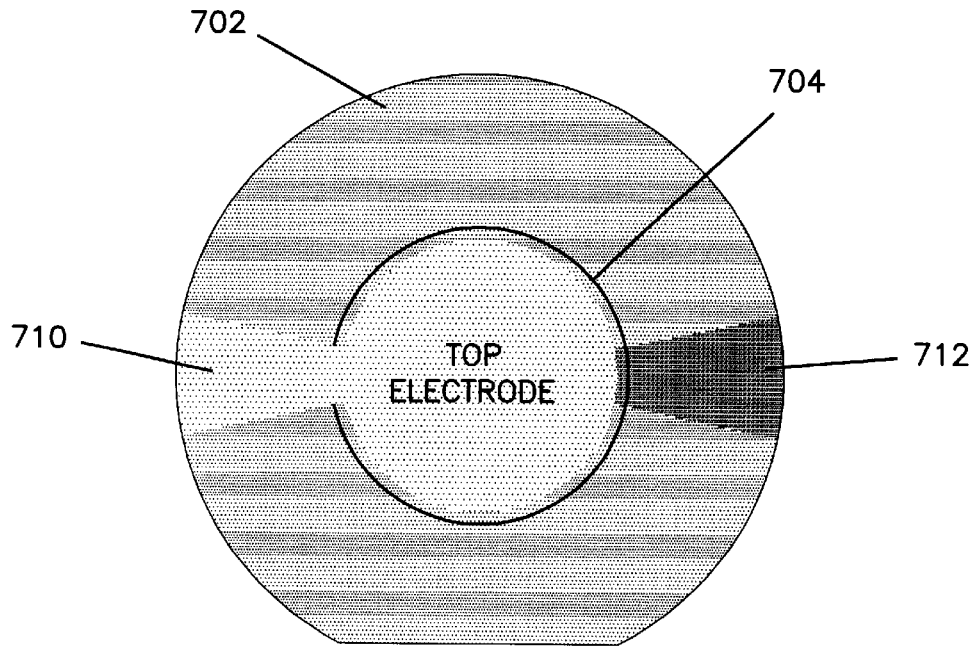
FIG. 7 illustrates a second embodiment of a resonator having a thin channel according to the invention.

FIG. 7 illustrates a second embodiment 700 of a resonator according to the invention. In this embodiment, thinner channels 704 are cut in the blank 702 to degrade the lower frequency overtone and fundamental responses. The electrode 710 is shown in the center of the resonator extending across the channel 704 to the edge of the blank-702. The second electrode 712 is disposed on the opposite side of the blank 702.

Figure 8:
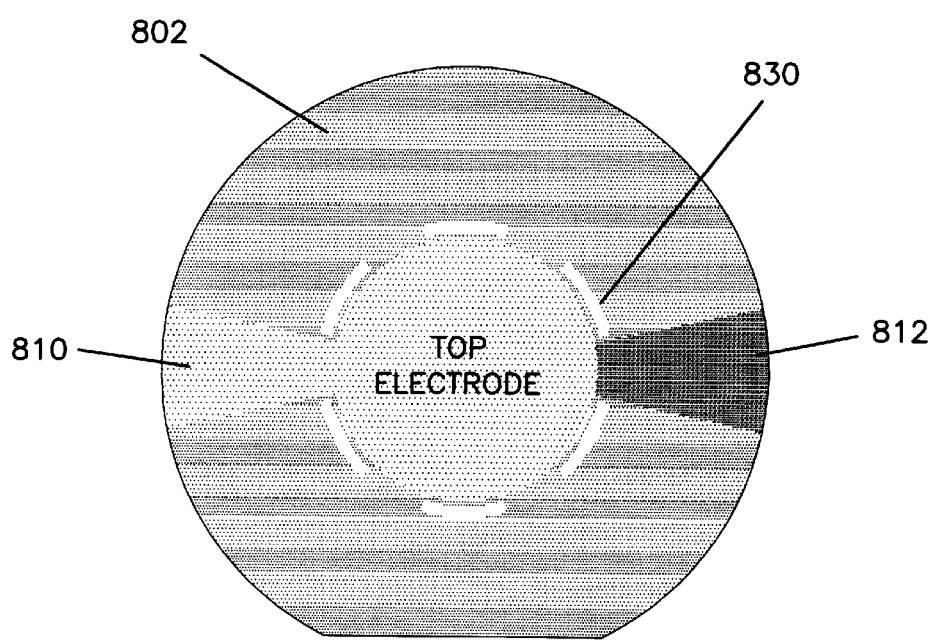
FIG. 8 illustrates a third embodiment of the present invention wherein the channel is formed by slots.

FIG. 8 illustrates a third embodiment 800 of a resonator according to the invention. In this embodiment, slots 830 form the channels in the blank 802 for degrading undesired frequency overtones and fundamental responses. The slots 830 are arranged to form a ring substantially circumscribing the electrode 810. Furthermore, the slots may be manifested by a narrow cut made through the entire thickness of the blank 802. The electrode 810 is shown in the center of the resonator extending across the channel slots 804 to the edge of the blank 802. Those skilled in the art will recognize that the slots may be formed in a circular pattern (as shown in FIG. 8) or may be formed in a radial formation.

Figure 9:
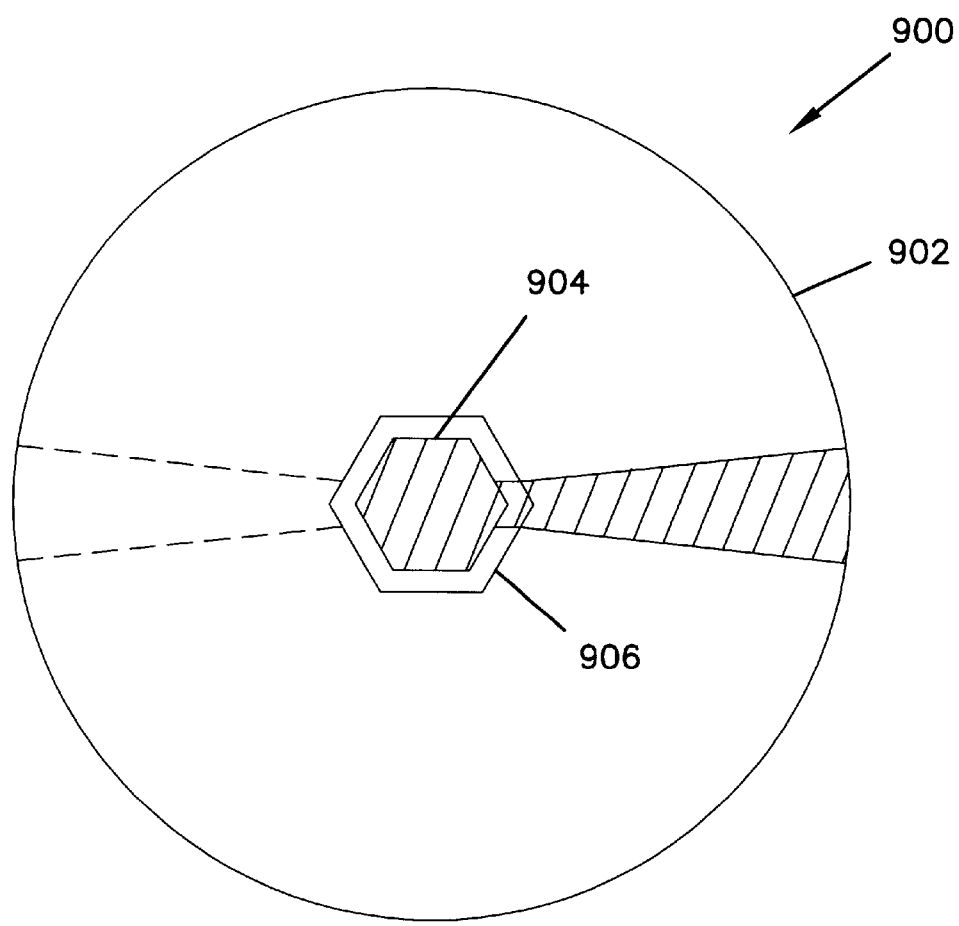
FIG. 9 illustrates a fourth embodiment of present invention wherein the channel is polygonal.

FIG. 9 illustrates a fourth embodiment of a resonator 900 constructed in accordance with the principles of the present invention. The resonator 900 includes a blank 902 on which electrodes 904 (only one shown) are mounted. A polygonal channel 906 surrounds at least one of the electrodes 904.

Figure 10:
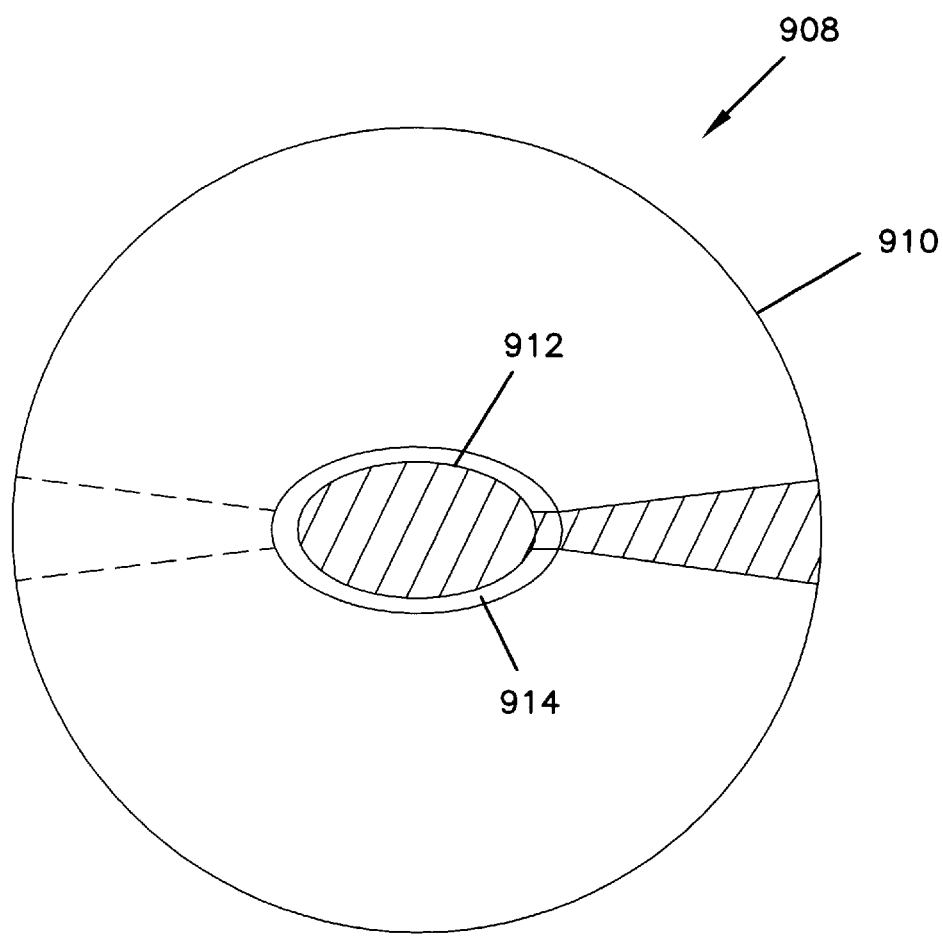
FIG. 10 illustrates a fifth embodiment of the present invention wherein the channel is elliptical.

FIG. 10 illustrates a fifth embodiment of a resonator 908 constructed in accordance with the principles of the present invention. The resonator 908 includes a blank 910 on which electrodes 912 (only one shown) are mounted. An elliptical channel 914 surrounds at least one of the electrodes 912.

Figure 11:
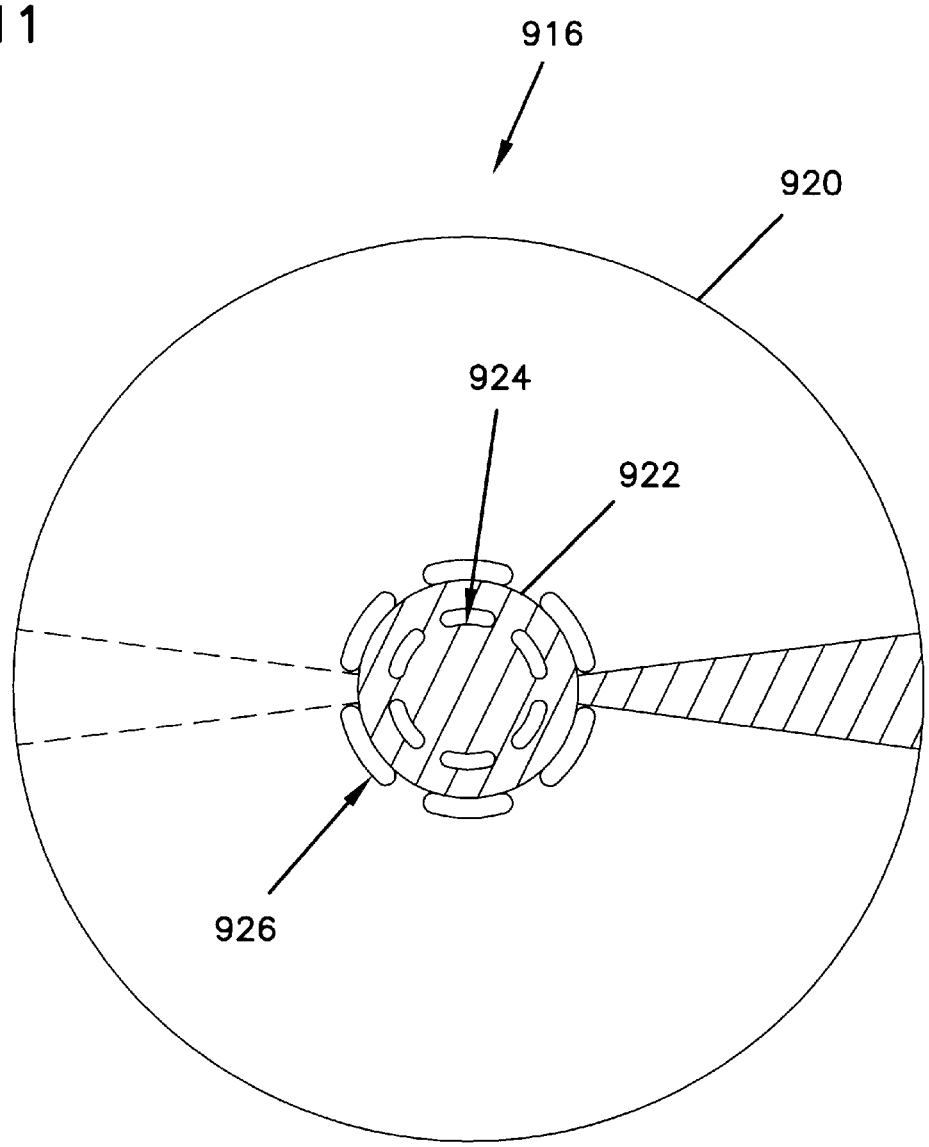
FIG. 11 illustrates a sixth embodiment of the present invention wherein the channel is located inside an outer boundary of the electrode.

FIG. 11 illustrates a sixth embodiment of a resonator 916 constructed in accordance with the principles of the present invention. The resonator 918 includes a blank 920 on which electrodes 922 (only one shown) are mounted. The first channel 924 formed by gaps in the electrode 922 is located inside an outer boundary of the electrode 922. A second channel 926 is positioned at the outer boundary.

In summary, a crystal may be formed having channel cuts to ensure that the desired overtone of the fundamental frequency has the lowest impedance. Those skilled in the art will recognize that the invention is not meant to be limited by the particular embodiments described above. The grooves of FIGS. 5 and 6 could be combined with slots of FIG. 8. The thinner channels of FIG. 7 could also be combined with the rings of FIG. 8. Moreover, the blank may be rectangular.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A resonator, comprising:
   a blank having piezoelectric properties, wherein the blank oscillates when stimulated;
   a plurality of electrodes, coupled to the blank, for providing a signal to the blank to cause the blank to become stimulated and oscillate at a fundamental frequency; and
   a channel cut into the blank, the position and dimension of the channel being selected to confine the oscillation to a region that maximizes the response at a desired frequency, the channel being formed by a plurality of discrete slots arranged to surround at least one of the electrodes, the slots being positioned directly at an outer edge of the at least one electrode.

2. The resonator of claim 1 wherein the desired frequency is a predetermined overtone of the fundamental frequency.

3. The resonator of claim 1 wherein the channel limits the area of oscillation of the blank.

4. The resonator of claim 1 wherein the slots extend completely through the blank.

5. The resonator of claim 1 wherein the plurality of slots are arranged to form a ring.

6. The resonator of claim 1 wherein the channel has an edge on antinodes of a Bessel function defining a radial node shape.

7. The resonator of claim 1 wherein the channel is relatively thin and is configured for degrading lower frequencies and fundamental responses.

8. A resonator, comprising:

a piezoelectric blank having oppositely positioned first and second sides;

first and second electrodes, coupled to the blank, for providing a signal to the blank to cause the blank to become stimulated and oscillate at a fundamental frequency, the first and second electrodes being respectively mounted at the first and second sides of the blank;

a base for providing leads to the resonator; and mounting clips, coupled to the electrodes, for providing a signal path between the leads of the base and the electrodes and for holding the blank in position;

wherein the blank further comprises a channel, the position and dimension of the channel being selected to confine the oscillation to a region that maximizes the response at a desired frequency, the channel being formed by a plurality of discrete slots arranged to surround at least the first electrode, the slots being positioned directly at an outer edge of the first electrode.

9. The resonator of claim 8 wherein the desired frequency is a predetermined overtone of the fundamental frequency.

10. The resonator of claim 8 wherein the channel limits the area of oscillation of the blank.

11. The resonator of claim 8 wherein the slots extend completely through the blank.

12. The resonator of claim 8 wherein the plurality of slots are arranged to form a ring.

13. The resonator of claim 8 wherein the channel has an edge on antinodes of a Bessel function defining a radial node shape.

14. The resonator of claim 8 wherein the channels are relatively thin and are arranged for degrading lower frequencies and fundamental responses.

15. A resonator comprising:

a piezoelectric blank;

a plurality of electrodes for oscillating the blank; and an elliptical channel structure provided in the blank, the channel structure being arranged and configured to confine the oscillation of the blank to a region that enhances an oscillation response at a desired frequency.

16. The resonator of claim 15, wherein the desired frequency is an overtone of a fundamental frequency of the blank.

17. A resonator comprising:

a piezoelectric blank;

a plurality of electrodes for oscillating the blank; and a polygonal channel structure provided in the blank, the channel structure being arranged and configured to confine the oscillation of the blank to a region that enhances an oscillation response at a desired frequency.

18. The resonator of claim 17, wherein the desired frequency is an overtone of a fundamental frequency of the blank.

19. A resonator comprising:

a piezoelectric blank having first and second oppositely disposed sides separated by a thickness;

a first electrode positioned at the first side of the blank and a second electrode positioned at the second side of the blank, the first and second electrodes cooperating to oscillate the blank, and at least one of the electrodes having an outer boundary; and a first channel structure defined by the resonator at a location positioned inside the outer boundary of the at least one electrode, the first channel structure being configured to enhance an oscillation response of the blank at a desired frequency, the channel structure being formed by a plurality of discrete gaps in the at least one electrode that surround an inner portion of the at least one electrode.

20. The resonator of claim 19, further comprising a second channel structure surrounding the outer boundary of the at least one electrode.

21. The resonator of claim 19, wherein, when the blank is oscillated at the desired frequency, the first channel structure is located at a node of a Bessel function defining a radial node shape.

22. The resonator of claim 19, wherein, when the blank is oscillated at the desired frequency, the first channel structure is located at an anti-node of a Bessel function defining a radial node shape.

* * * * *